United States Patent
Wang et al.

[11] Patent Number: 6,064,570
[45] Date of Patent: *May 16, 2000

[54] COMPUTER PROCESSOR/HEAT SINK ASSEMBLY HAVING A DUAL DIRECTION AIR FLOW PATH

[75] Inventors: Ray Wang; Peter Liu, both of Austin, Tex.

[73] Assignee: Dell U.S.A., L.P., Round Rock, Tex.

[*] Notice: This patent issued on a continued prosecution application filed under 37 CFR 1.53(d), and is subject to the twenty year patent term provisions of 35 U.S.C. 154(a)(2).

[21] Appl. No.: 09/048,478

[22] Filed: Mar. 26, 1998

[51] Int. Cl.⁷ ........................................ H05K 7/20
[52] U.S. Cl. .................... 361/695; 165/80.3; 257/713; 361/719
[58] Field of Search ................ 174/16.3; 165/80.3, 165/185, 121–126; 454/184; 257/712, 713, 722; 364/708.1; 361/687, 690, 694, 695, 697, 702, 704, 722, 717–719

[56] References Cited

U.S. PATENT DOCUMENTS

| | | |
|---|---|---|
| 5,535,094 | 7/1996 | Nelson . |
| 5,630,469 | 5/1997 | Butterbaugh . |
| 5,634,351 | 6/1997 | Larson et al. . |
| 5,673,029 | 9/1997 | Behl et al. . |
| 5,673,176 | 9/1997 | Penniman et al. . |
| 5,828,549 | 10/1998 | Gandre . |
| 5,829,515 | 11/1998 | Jeffries . |
| 5,831,847 | 11/1998 | Love . |
| 5,841,633 | 11/1998 | Huang . |

FOREIGN PATENT DOCUMENTS 5-259673  10/1993  Japan ..................................... 361/697

*Primary Examiner*—Gerald Tolin
*Attorney, Agent, or Firm*—Haynes and Boone, LLP

[57] ABSTRACT

A computer processor/heat sink assembly in which a heat sink is provided extending adjacent a processor or electrical component to be cooled. The heat sink has a plurality of spaced fins having openings therein and is positioned in an air flow path so that the air flows through the openings to dissipate heat from the processor to the air. The assembly can also be positioned in a second position in the air flow path so that the air flows between the fins to dissipate heat from the processor to the air.

10 Claims, 2 Drawing Sheets

COMPUTER PROCESSOR/HEAT SINK ASSEMBLY HAVING A DUAL DIRECTION AIR FLOW PATH

TECHNICAL FIELD

This disclosure relates generally to the field of computers, and more particularly to a computer/heat sink assembly that provides a dual direction cooling air flow path.

BACKGROUND

As computers shrink in size, the power consumed within the computer chassis per unit volume increases dramatically. Thus, it becomes essential to dissipate the heat generated by components within the computer during operation to ensure that the components remain within their normal operating temperature ranges since, otherwise, the components will fail immediately or will have too short a lifetime.

This heat dissipation is especially critical in connection with processors used in the computer, especially those that operate at relatively high speeds. To increase the heat dissipation from the processor, the processor is often provided with a heat sink which provides an increased surface area for dissipating the heat. In these designs, an internal fan is usually provided on a wall of the chassis of the computer to apply a relatively high velocity air across the surface of the processor and its heat sink to force cool the processor. This raises the convective heat transfer coefficient for the surface of the processor and increases the convection cooling.

Most processor heat sinks are designed so that they must be oriented in a specific manner with respect to the air flow from the fan. For example, many heat sinks are designed so that the air must flow in a path parallel to (or coincidental with) the longitudinal axis of the heat sink. However, the mechanical design and layout of computers vary considerably from model to model, even with the same manufacturer, often requiring that the heat sink be oriented with its longitudinal axis extending perpendicular to the direction of air flow. This requires two separate heat sinks, one for use when the air flow path extends parallel to its longitudinal axis and one for use when the air flow path extends perpendicular to its longitudinal axis. This, of course, is expensive and considerably adds to the cost of the computer.

Therefore, what is needed is a processor/heat sink assembly that be located in a computer chassis in two orientations relative to the air flow path yet provides signficant surface area for dissipating heat.

SUMMARY

Accordingly, an embodiment of the present disclosure is directed to processor/heat sink assembly which includes a sink extending adjacent a processor or electrical component to be cooled. The heat sink has a plurality of spaced fins having openings therein, and is positioned in an air flow path so that the air flows through the openings to dissipate heat from the processor to the air. The assembly can also be positioned in a second position in the air flow path so that the air flows between the fins to dissipate heat from the processor to the air.

DETAILED DESCRIPTION OF THE PREFERRED EMBODIMENT

Figure 1:
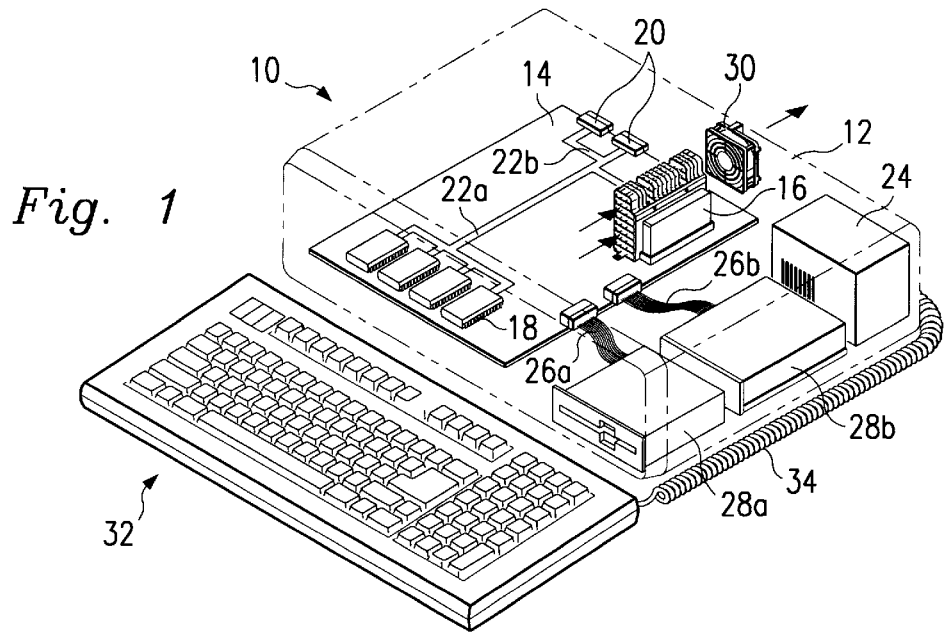
FIG. 1 is an isometric view of an embodiment of a computer employing the processor/heat sink assembly according to an embodiment of the present disclosure.

FIG. 1 of the drawings depict a computer 10 according to an embodiment of the present disclosure which is in the form of desktop computer. The computer 10 includes a chassis 12 (shown in phantom lines) in which a motherboard 14 is mounted. A processor/heat sink assembly 16, four memory modules 18, and two input/output (I/O) devices 20 are mounted on the motherboard 14. Two buses 22a and 22b are also provided on the motherboard 14 that connect the processor of the processor/heat sink assembly 16 to the memory modules 18 and to the input/output devices 20, respectively.

A power supply 24 is connected to the motherboard 16 and a pair of cable assemblies 26a and 26b connect the motherboard 14 to a disk drive unit 28a and a hard drive unit 28b, respectively. A fan assembly 30 is mounted to the rear wall of the chassis 12, extends over an opening in the latter wall, and functions to draw air through the chassis 12, across the processor/heat sink assembly 16 and force it out the latter opening, in a conventional manner. It is understood that other components, electrical traces, electrical circuits and related devices (not shown) are provided in the chassis 10. A keyboard 32 is provided adjacent the computer 10 and is connected to the computer by a cable 34. Since, with the exception of the processor/heat sink assembly 16, all of the above components are conventional, they will not be described in any further detail.

Figure 2:
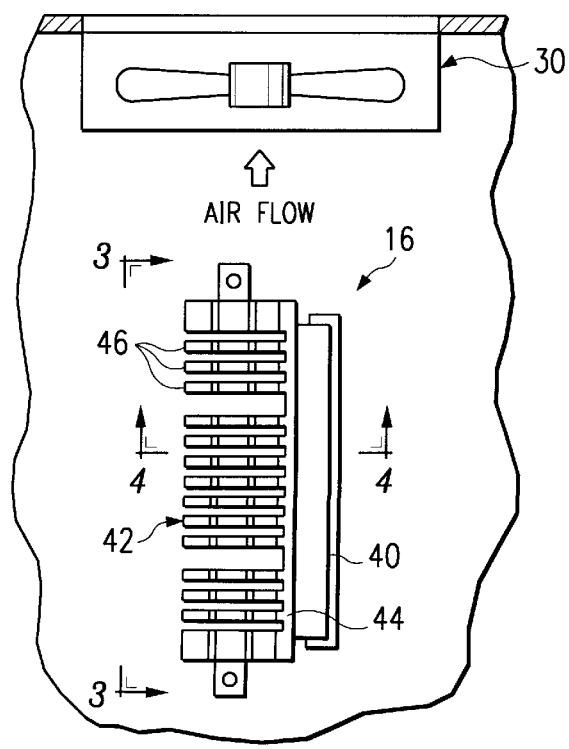
FIG. 2 is an enlarged plan view depicting the processor/heat sink assembly of FIG. 1.
Figure 3:
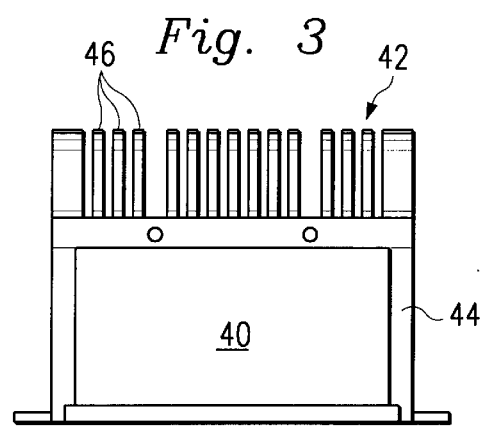
FIGS. 3 and 4 are views taken along the lines 3—3 and 4—4, respectively, of FIG. 2.

The processor/heat sink assembly 16 is shown in detail in FIGS. 2 and 3 and includes a processor 40 mounted to a heat sink 42. The processor 40 is of a conventional design and, as such, includes a casing that has a height less than its width as viewed in FIG. 3, and a thickness, or depth, as viewed in FIG. 2, less than its height. The lower end of the processor 40 is provided with an electrical connector 40a (FIG. 4) that plugs into a connector 43 on the motherboard 14 (FIG. 1) in a conventional manner.

The heat sink 42 is formed by a mounting plate 44 to which the processor 40 is mounted in any conventional manner, such as by thermal welding. The heat sink 42 also includes a plurality of spaced fins 46 extending from the mounting plate 44. Each fin 46 is rectangular in cross section and formed integrally with the plate along one longitudinal edge.

Figure 4:
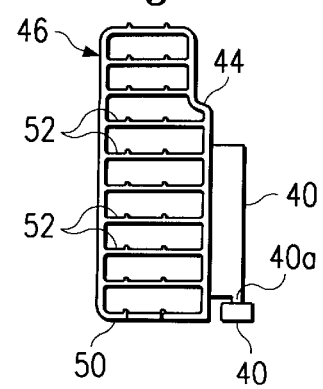

As better shown in FIG. 4, each fin 46 is formed by a rectangular frame 50 having a plurality of spaced cross bars 52 extending transversely to the longitudinal axis of the frame. One longitudinally extending leg of the frame is formed integrally with the mounting plate 44 and, preferably, the frame 50 and the cross bars 52 are also formed integrally. The upper end portions of the fins 46 extend above the mounting plate 44, and therefore the processor 40.

FIGS. 1 and 2 depict the assembly 16 mounted on the motherboard 14 with the respective longitudinal axes of the processor 40 and the heat sink 42 extending parallel to the direction of air flow from the interior of the chassis 12 and through the fan 30 and the opening in the chassis wall as shown by the flow arrows. The fan 30 therefore draws air from the interior of the chassis 12 and through the fins 46 of the heat sink 42 and, more particularly, through the spaces between the frame 50 and the bars 52 of each fin. Heat from the processor 40 is dissipated by the heat sink 42 and is transferred to the air before the air exits the chassis through the fan 30 and the opening in the chassis wall.

Figure 5:
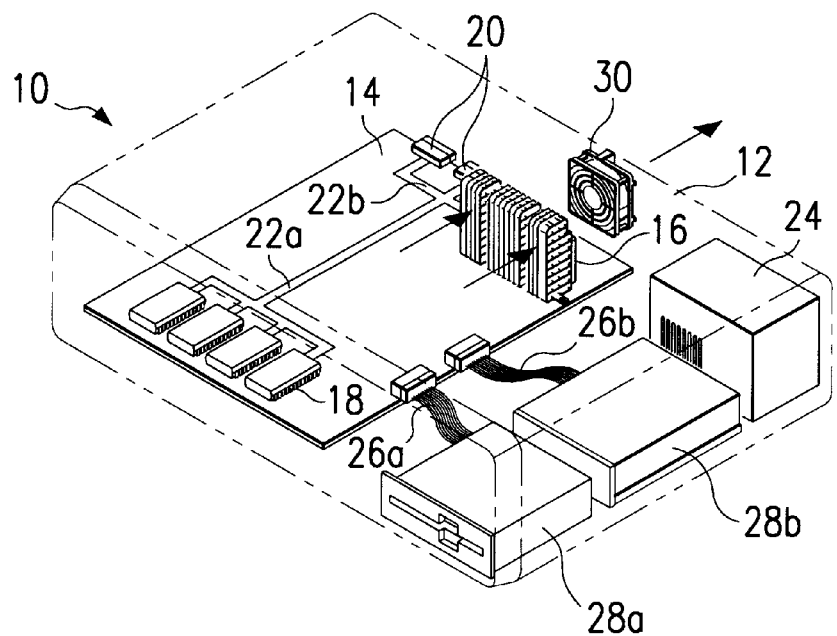
FIGS. 5 and 6 are views similar to FIGS. 1 and 2, respectively, but depicting the processor/heat sink assembly of FIGS. 1 and 2 oriented in a different direction.
Figure 6:
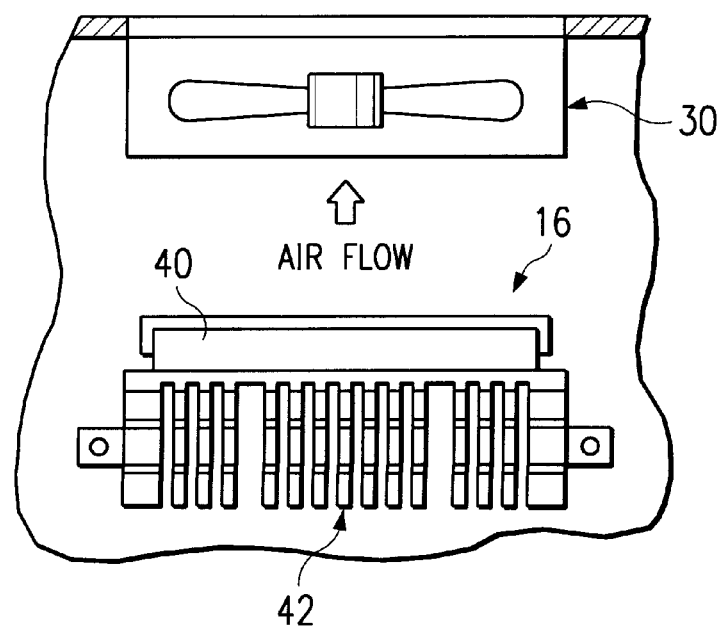

Alternately, when the design of the computer 10 and the layout of the interior of the chassis 12 so dictate, the assembly 16 can be mounted on the motherboard 14 with the longitudinal axis of the processor 40 extending perpendicular to the direction of air flow through the fan 30, as shown in FIGS. 5 and 6. In this position of the assembly 16, the fan 30 draws air through the spaces between the portions of the fins 46 of the heat sink 42 that extend above the upper surface of the processor 40 to transfer heat from the processor 40 to the air before it exits the chassis 12 in the manner described above.

In both of the positions of the processor/heat sink assembly 16 shown in FIGS. 1 and 2 and in FIGS. 5 and 6, respectively, the added surface area provided by the fins 46 of the heat sink 42 effectively dissipates a significant amount of heat from the processor 40 during operation of the computer 10 which heat is transferred to the air exiting the chassis 12 through the fan 30.

The processor/heat sink assembly 16 of the present disclosure thus can be located in the chassis 12 in two orientations relative to the air flow path through the chassis, yet provide significant dissipation of heat from the processor 40. Therefore, the processor 40 is kept at a temperature within its normal operating temperature range and the possibility of premature failure is minimized.

It is understood that variations may be made in the foregoing without departing from the scope of the invention. For example, the embodiment described above is not limited to use with a desktop computer as described above by means of example, but is equally applicable to any type of self-contained computer, such as laptop computers, notebook computers, tower computers, servers, and the like. Moreover, the heat sink 42 can be used in connection with other heat generating components in a computer or in any electrical device. Also, the fan assembly 30 can be designed to reverse the air flow, that is, it can pull ambient air through the opening in the wall of the chassis 12, and force the air over the processor/heat sink assembly. Further, the heat sink 42 can be formed integrally with the processor 40 and/or the fins 46 of the heat sink can be formed separately from the mounting plate 44 and connected thereto in any known manner.

It is also understood that the disclosure described above is intended to illustrate rather than limit, and that the mounting assembly can take many other forms and embodiments within the scope of the invention.

What is claimed is:

1. A computer comprising:
    a chassis;
    at least one memory disposed in the chassis;
    at least one circuit board disposed in the chassis;
    a heat sink comprising:
        a mounting plate having an upper surface and a lower surface, and
        a plurality of spaced fins extending from the mounting plate, each fin having an opening extending therethrough and an upper portion extending above the upper surface of the mounting plate;
    at least one processor mounted to the mounting plate;
    a fan mounted to the chassis for flowing air in a flow path through the chassis;
    means for mounting the mounting plate along its lower surface to the circuit board in a first position in which the air passes through the openings in the fins; and
    means for mounting the mounting plate in a second position in which the air passes through spaces between the upper portions of the fins.

2. The computer of claim 1 wherein the mounting plate has a longitudinal axis and wherein, in the first position of the mounting plate, the longitudinal axis extends in the same direction as the direction of the air flow.

3. The computer of claim 2 wherein, in the second position of the mounting plate, the longitudinal axis extends perpendicular to the direction of the air flow.

4. The computer of claim 1 wherein each fin comprises a rectangular frame and a plurality of spaced bars extending along the frame.

5. A processor/heat sink assembly for mounting on a circuit board in a component having a fan for blowing air across the circuit board, the assembly comprising:
    a heat sink comprising:
        a mounting plate having an upper surface and a lower surface, and
        a plurality of spaced fins extending from the mounting plate, each fin having an opening extending therethrough and an upper portion extending above the upper surface of the mounting plate;
    a processor mounted to the mounting plate,
    means for mounting the mounting plate along its lower surface to the circuit board in a first position in which the air passes through the openings in the fins; and
    means for mounting the mounting plate in a second position in which the air passes through spaces between the upper portions of the fins.

6. The assembly of claim 5 wherein the fins extend from another surface of the mounting plate and the processor is mounted to another surface of the mounting plate opposite the surface from which the fins extend.

7. The assembly of claim 5 wherein the mounting plate has a longitudinal axis which, in the first position of the mounting plate, extends in the same direction as the direction of the air flow.

8. The assembly of claim 7 wherein, in the second position of the mounting plate, the longitudinal axis extends perpendicular to the direction of the air flow.

9. The assembly of claim 5 wherein each fin comprises a rectangular frame and a plurality of spaced bars extending along the frame.

10. The assembly of claim 5 wherein the fins extend from another surface of the mounting plate and the processor is mounted to another surface of the mounting plate opposite the surface from which the fins extend.

* * * * *